(12) United States Patent
Chang

(10) Patent No.: US 7,700,965 B2
(45) Date of Patent: Apr. 20, 2010

(54) LIGHT EMITTING DIODE

(75) Inventor: Chia-Shou Chang, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/171,287

(22) Filed: Jul. 10, 2008

(65) Prior Publication Data

US 2009/0278149 A1 Nov. 12, 2009

(30) Foreign Application Priority Data

May 7, 2008 (CN) .................. 2008 1 0066965

(51) Int. Cl.
*H01L 33/00* (2006.01)

(52) U.S. Cl. .............. 257/98; 257/79; 257/99; 257/100; 257/E21.252; 257/E21.274; 257/E21.311; 257/E23.061

(58) Field of Classification Search ............ 257/79, 257/98–100
See application file for complete search history.

(56) References Cited

U.S. PATENT DOCUMENTS

| 6,809,342 | B2 * | 10/2004 | Harada | 257/79 |
| 7,227,195 | B2 * | 6/2007 | Takahashi et al. | 257/100 |
| 2005/0139851 | A1 * | 6/2005 | Sato | 257/99 |
| 2008/0191620 | A1 * | 8/2008 | Moriyama et al. | 313/506 |
| 2009/0039762 | A1 * | 2/2009 | Park et al. | 313/502 |

FOREIGN PATENT DOCUMENTS

WO WO 2005/091387 * 9/2005

* cited by examiner

*Primary Examiner*—A. Sefer
(74) *Attorney, Agent, or Firm*—Frank R. Niranjan

(57) ABSTRACT

An LED (20) includes a base (24), a chip (21) and an encapsulation (22) made of a transparent material. The base has a concave depression (240). The chip is mounted on a bottom of the concave depression. The first encapsulation is received in the depression for sealing the chip. The chip includes a light emitting surface (210). The encapsulation includes a light output surface (25) over the light emitting surface. The light output surface defines a plurality of recesses (26). A mixture (29) formed by mixing another transparent material (27) and fluorescent powder (28) is filled in each of the recesses.

8 Claims, 3 Drawing Sheets

LIGHT EMITTING DIODE

BACKGROUND

1. Field of the Invention

The present invention generally relates to a light emitting diode (LED), and more particularly to an LED which can provide a uniform illumination.

2. Description of Related Art

Light emitting diodes (LEDs) are a commonly used light source in applications including lighting, signaling, signage and displays. The LED has several advantages over incandescent and fluorescent lamps, including high efficiency, high brightness, long life, and stable light output. The LED creates much higher illumination and space brightness with less electricity consumption.

A conventional LED generally includes a base, a chip mounted on the base, and an encapsulation sealing the chip. The encapsulation is made of a transparent or translucent epoxy resin and usually has an output surface. The LED emits light rays towards the output surface. A portion of the light rays, especially those incident on lateral parts of the output surface, will be reflected at the output surface and cannot be wholly emitted to an outside of the LED. Even, because angles between the lateral parts of the output surface and the chip are so large, the light rays incident on the lateral parts may be totally reflected. As a result, a large light density on a central part and a small light density on the lateral parts of the output surface are formed. Thus, the LED cannot provide a uniform illumination.

Therefore, there is a need for an LED, which can provide a uniform illumination.

SUMMARY

An exemplary LED includes a base, a chip and an encapsulation. The encapsulation is formed by first kind of transparent material. The base has a concave depression. The chip is mounted on a bottom of the concave depression. The encapsulation is received in the depression for sealing the chip. The chip includes a light emitting surface. The encapsulation includes a light output surface over the light emitting surface. The light output surface defines a plurality of recesses. A mixture formed by mixing a second kind of transparent material and fluorescent powder is filled in each of the recesses.

Other advantages and novel features of the present invention will become more apparent from the following detailed description of an embodiment/embodiments when taken in conjunction with the accompanying drawings.

DETAILED DESCRIPTION

Figure 1:
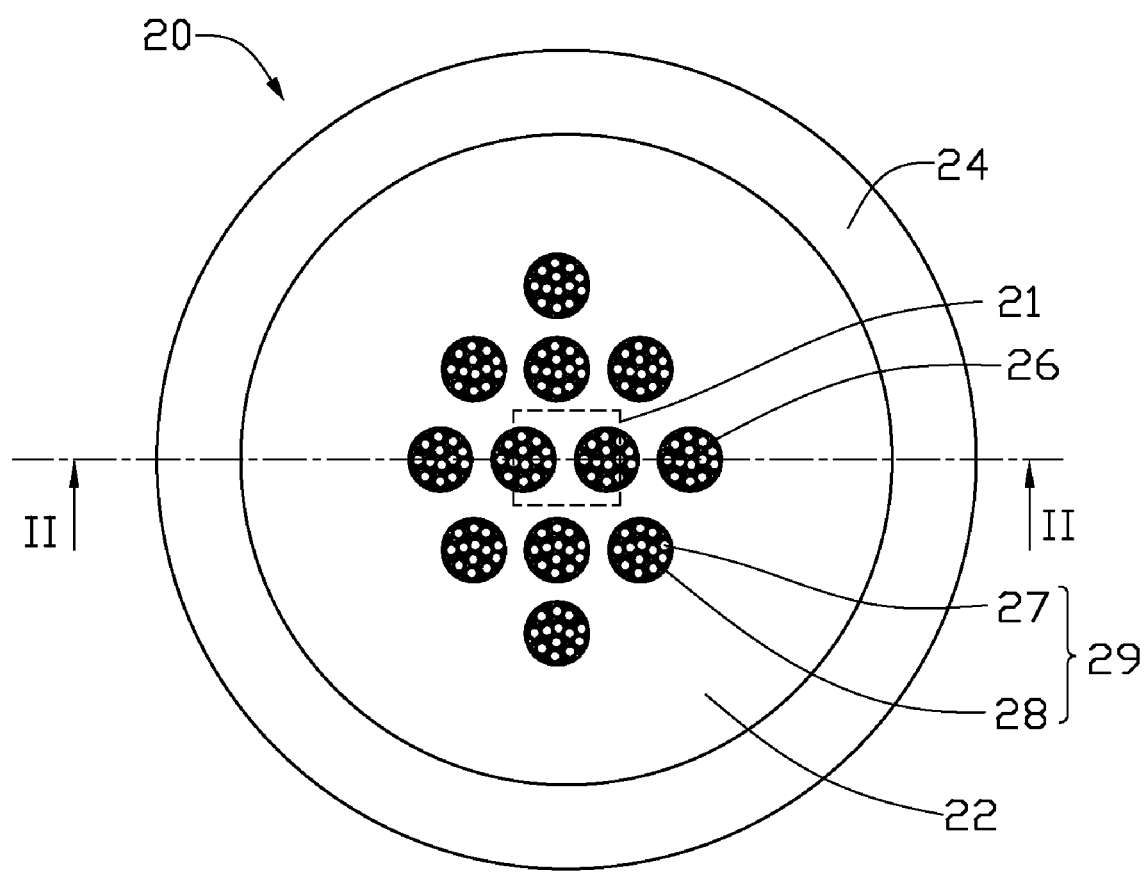
FIG. 1 is a top plan] view of an LED in accordance with an embodiment of the prevent invention.
Figure 2:
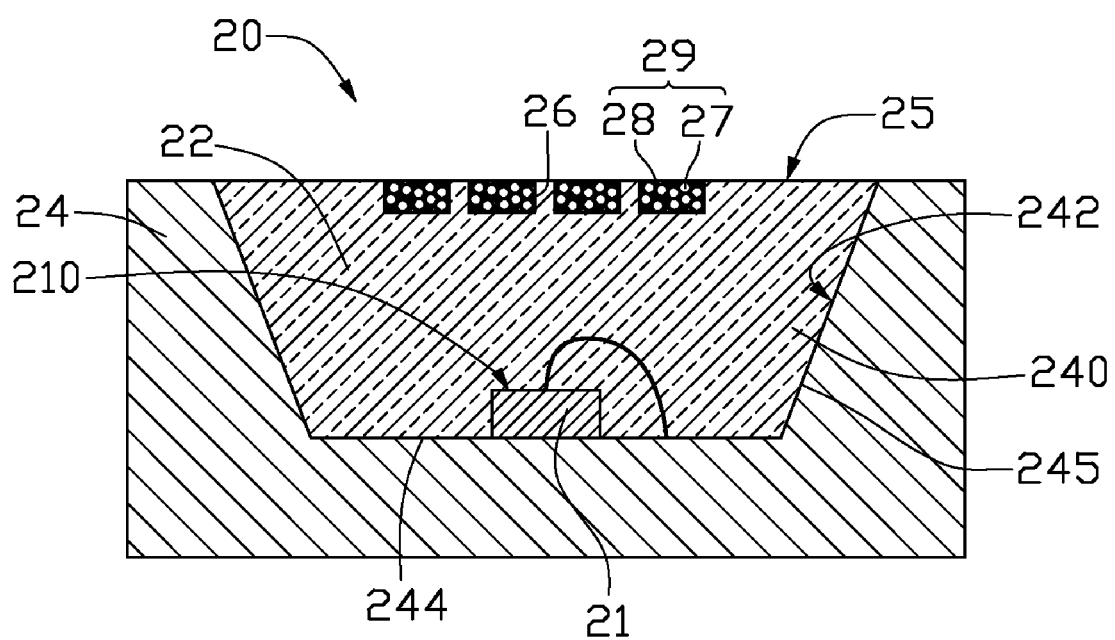
FIG. 2 is a cross-sectional view of the LED shown in FIG. 1, along line II-II thereof.

Referring to FIGS. 1 and 2, an LED 20 in accordance with an embodiment of the present invention is illustrated. The LED 20 comprises a chip 21, an encapsulation 22 and a base 24. The chip 21 is disposed on the base 24. The encapsulation 22 is received in the base 24 for sealing the chip 21. The chip 21 is used to emit light rays.

The base 24 has a cup-shaped configuration and has a concave depression 240 defined therein. The depression 240 has a trapeziform cross section 242. The depression 240 includes a flat bottom wall 244 and a sidewall 245 slantwise extending upwardly from a periphery of the bottom wall 244 so that the depression 240 has a narrow bottom portion and a wide top portion.

The chip 21 has a light emitting surface 210 on a top thereof which can generate blue light rays. Alternatively, the chip 21 can use other kinds of chip which can emit light rays of different colors. The chip 21 is mounted on a center of the bottom wall 244 of the depression 240 via a silver paste or other conventional method. The chip 21 electrically connects to electric components (not shown) such as electrodes arranged in the base 24 so that the chip 21 is electrically connected to a printed circuit board (not shown) on which the LED 20 is mounted.

The encapsulation 22 is made of a first transparent material, such as silicone. The encapsulation 22 serves to redirect the light rays from the chip 21 in addition to protecting the chip 21 from external physical shock. The encapsulation 22 fills in the concave depression 240, and adheres to the bottom wall 244 and the sidewall 245 of the concave depression 240. The chip 21 is covered by the encapsulation 22. The encapsulation 22 has a flat light output surface 25 opposite to the light emitting surface 210 of the chip 21. The light output surface 25 is located on a top of the encapsulation 22.

A plurality of circular recesses 26 are defined on the light output surface 25. The recesses 26 are distributed in a central area of the light output surface 25 and over the chip 21. The recesses 26 are spaced from each other at uniform intervals. Each of the recesses 26 is filled with a mixture 29, which includes fluorescent powder 27 and a second transparent material 28. The fluorescent powder 27 is uniformly mixed with the second transparent material 28. The second transparent material 28 has a refractive index larger than that of the encapsulation 22. The second transparent material 28 may be epoxy resin. The fluorescent powder 27 can generate yellow light rays after absorbing blue light rays. The yellow light rays interact with the blue light rays to form white light rays. Alternatively, other kinds of fluorescent powder can be used instead of the fluorescent powder 27 so long as the first light rays emitted by the chip 21 can mix with the second light rays generated by the fluorescent powder after absorbing the first light rays to form white light rays.

Figure 3:
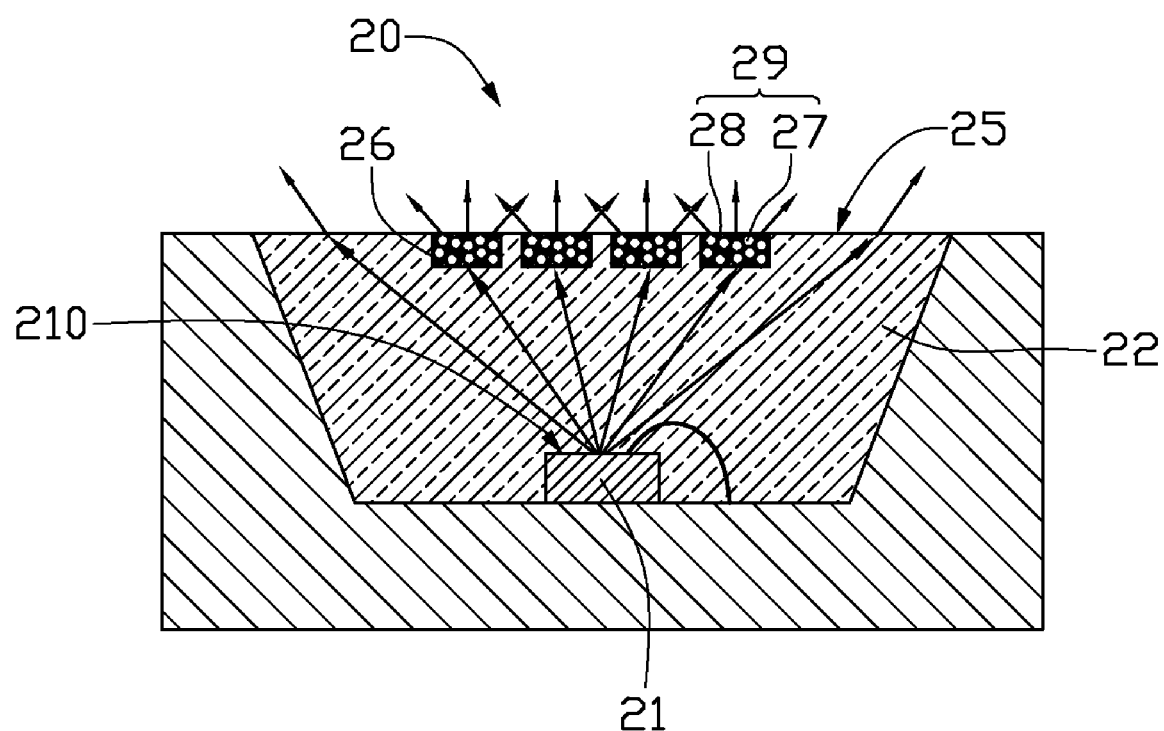
FIG. 3 is similar to FIG. 2, but shows a light path of light rays emitted from a chip of the LED.

Referring to FIG. 3, in operation, blue light rays are emitted out from the light emitting surface 210 of the chip 21, then pass through the encapsulation 22, and finally fall incident on the light output surface 25. A central portion of the blue light rays pass through the recesses 26 via refraction. The fluorescent powder 27 of the mixture 29 filled in the recesses 26 radially and outwardly generates yellow light rays towards ambience after absorbing the blue light rays. The yellow light rays are dispersed towards ambient air over the light output surface 25, including lateral directions of the LED 20. Another portion of the blue light rays comes out from other parts of the light output surface 25 without the recesses 26. The yellow light rays from the fluorescent powder 27 in the recesses 26 interact with the another portion of the blue light rays, thereby forming white light rays. Thus, the LED 20 provides a uniform illumination towards ambient air over the light output surface 25. Moreover, the mixture 29 in the recesses 26 facilitates extraction of light to the outside of the LED 20 and the light extraction efficiency of the LED 20 can be improved. The second transparent material 28 has a refractive index which is larger than that of the encapsulation 22 so that the light loss caused by total reflection can be greatly reduced.

The LED 20 can be produced by a method which is described below.

Firstly, a chip 21 and a base 24 are provided. The base 24 has a concave depression 240 defined therein. The chip 21 is disposed in the depression 240 with the chip 21 electrically connecting to electric components (not shown) arranged in the base 24. The chip 21 is mounted on the base 24 via a silver paste or other conventional method.

Secondly, an encapsulation 22 of a first transparent material is disposed into the depression 240 of the base 24 to encapsulate the chip 21. Particularly, the first transparent material, such as silicone, is firstly heated up until the material is changed from solid into liquid, and then the liquefied material is poured into the depression 240 of the base 24 to form the encapsulation 22.

Thirdly, a plurality of recesses 26 are defined in the light output surface 25.

Fourthly, a fluorescent powder 27 and a second transparent material 28 are mixed uniformly to form the mixture 29, wherein the second transparent material 28 has a refractive index larger than that of the first transparent material of the encapsulation 22.

Finally, the mixture 29 is injected into each of the recesses 26. Thus, an LED 20 is formed.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED comprising:
   a base having a concave depression;
   a chip mounted on a bottom of the concave depression;
   a first transparent material received in the depression and sealing the chip,
   wherein the chip includes a light emitting surface, the first transparent material includes a light output surface over the light emitting surface and faces ambient air, the light output surface defines a plurality of recesses, and a mixture comprising a second transparent material and fluorescent powder is filled in each of the recesses, the first and second transparent materials having different refractive indexes; and
   wherein the chip generates first light rays, the fluorescent powder generates second light rays after absorbing a portion of the first light rays which falls incident on the mixtures in the recesses, and another portion of the first light rays directly coming out to the ambient air via other parts of the light output surface without the recesses interacts with the second light rays to form third light rays.

2. The LED as claimed in claim 1, wherein the LED is located on a center of the concave depression, and the recesses are distributed in a central area of the light output surface.

3. The LED as claimed in claim 1, wherein the second transparent material has a refractive index which is larger than that of the first transparent material.

4. The LED as claimed in claim 1, wherein the first transparent material is an encapsulation for encapsulating the chip.

5. The LED as claimed in claim 1, wherein the first transparent material is made of silicone, and the second transparent material is made of epoxy resin.

6. The LED as claimed in claim 1, wherein the third light rays are white light rays.

7. The LED as claimed in claim 6, wherein the chip can generate blue light rays, and the fluorescent powder can generate yellow light rays after absorbing the blue light rays.

8. The LED as claimed in claim 1, wherein the concave depression includes a flat bottom wall and a sidewall slantwise extending upwardly from a periphery of the bottom wall so that the depression has a narrow bottom portion and a wide top portion.

* * * * *